DIFFERENTIAL DC AMPLIFIER
Filed Sept. 14, 1966
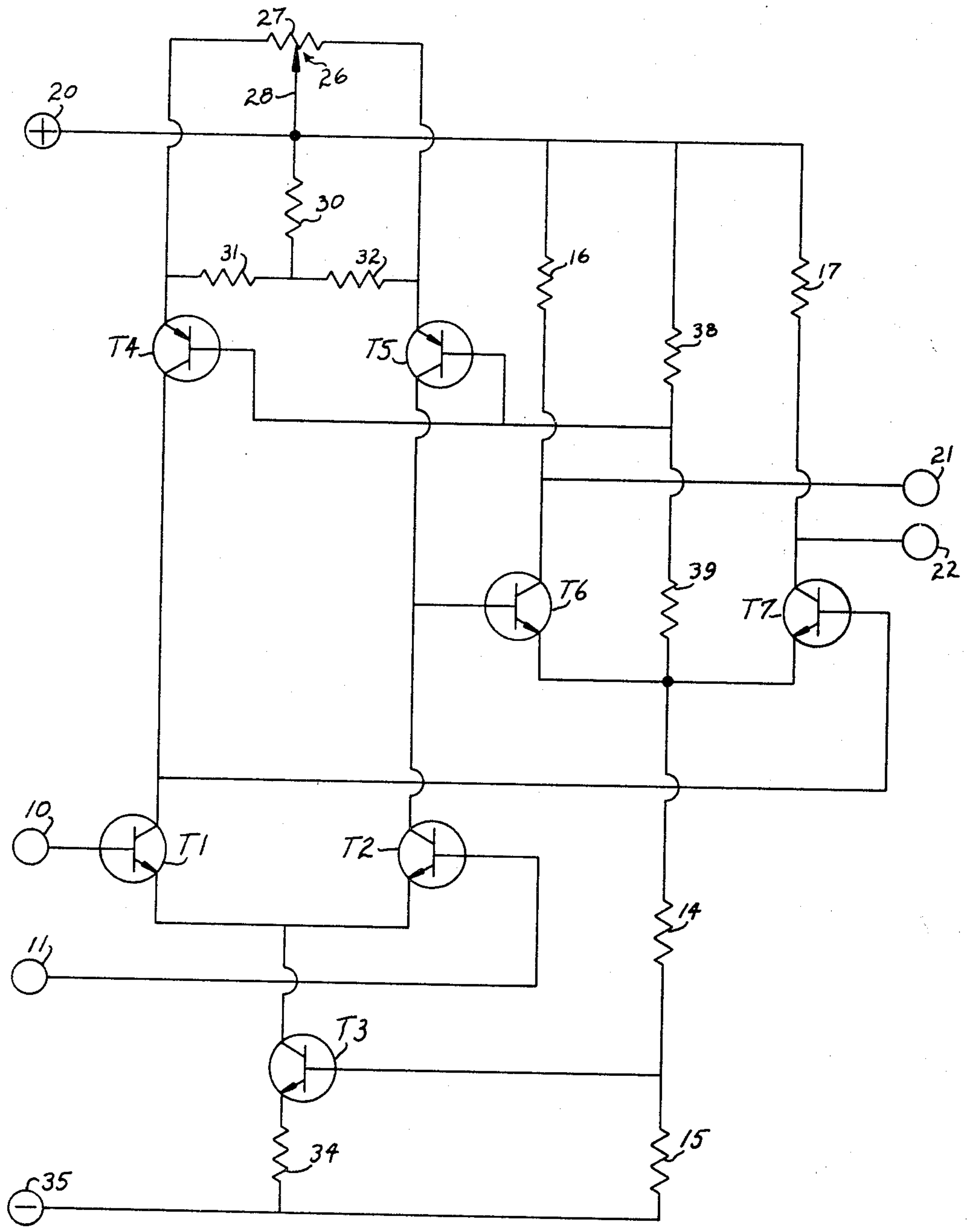
INVENTORS
DONALD R. McGRAW
JERALD G. GRAEME
BY
Drummond & Cahill
ATTORNEYS

United States Patent Office 3,440,554

Patented Apr. 22, 1969

3,440,554

DIFFERENTIAL DC AMPLIFIER

Donald R. McGraw and Jerald G. Graeme, Tucson, Ariz., assignors to Burr-Brown Research Corporation, Tucson, Ariz., a corporation of Arizona Filed Sept. 14, 1966, Ser. No. 579,340

Int. Cl. H03f 3/04, 3/68, 1/32

U.S. Cl. 330—30 10 Claims

The present invention relates to transistor differential amplifiers, and more specifically, to differential amplifiers for use in high performance, low level applications.

The substantial increase in the utilization of transistorized DC amplifiers has given rise to problems of environmental nature heretofore requiring compensation in the design of the transistor circuits. The desirability of high input impedance and low or substantially zero input offset voltage drift with temperature has resulted in prior art circuit designs that are expensive to fabricate using integrated circuit techniques. Characteristically, DC transistorized differential amplifiers require resistances of high value in the emitter-collector circuits of the first stage; these high resistances are difficult and expensive to form and are therefore not particularly adaptable to integrated circuit fabrication techniques.

The wide variety of applications in which transistorized differential DC amplifiers are used also gives rise to the temperature variation of the parameters of the transistors. It has been found that operation of transistors of the same type at the same base-to-emitter bias voltage will result in the temperature coefficients of the base-to-emitter voltage being approximately equal. The conclusion drawn in the prior art thus led to the compensation of temperature deviation of the transistors through the utilization of different collector currents in the transistors of the input stage in an attempt to maintain a constant base-to-emitter bias voltage. The proposed self-compensation has resulted in prior art circuits utilizing complicated compensation schemes incorporating additional resistors. These methods compensate for, but do not eliminate, the difference between the base emitter voltages of the input transistors. The thermal voltage drift of the input transistors is therefore not improved to the extent possible if the difference were eliminated.

It is therefore an object of the present invention to provide a differential amplifier without high resistors and therefore capable of economical reproduction by integrated circuit techniques.

It is another object of the present invention to provide a transistor differential amplifier wherein the typically high collector resistance of the first stage is eliminated.

It is still another object of the present invention to provide a transistor differential amplifier having improved thermal voltage drift of the input transistors.

It is another object of the present invention to provide a transistor differential amplifier in which cancellation of the input offset voltage is utilized to decrease the drift of offset voltage with temperature variations.

These and other objects of the present invention will become apparent to those skilled in the art as the description thereof proceeds.

The embodiment chosen for illustration, shown in the drawing, is a two-stage differential amplifier having a current source transistor connected to the emitters of the first stage and incorporating a common mode negative feedback loop. In the description of the drawing, the terminology "common mode" and "differential mode" shall have meanings ordinarily understood by those in the art; that is, common mode is defined as half the sum of the voltages applied to the input terminals, and the differential mode is defined as half the difference of the voltages applied to the input terminals.

Referring to the drawing, input terminals 10 and 11 are connected to the base electrodes of transistors T1 and T2 respectively. Transistors T1 and T2 comprise the input stage of the differential amplifier and have their emitter electrodes connected in parallel to the collector electrode of an emitter current source transistor T3. The collector electrodes of transistors T1 and T2 are each connected to the collector electrodes of dynamic load transistors T4 and T5 respectively. The dynamic load transistors are complementary to their respective connected input transistors T1 and T2. The dynamic load transistors provide a current source to the input transistors and also provide impedances of several hundred thousand ohms while nevertheless readily permitting economic integrated circuit fabrication.

The second-stage transistors T6 and T7 are each connected via their respective base electrodes to the collector electrodes of one of the input transistors. The emitter electrodes of the transistors T6 and T7 are connected together and to a voltage divider comprising resistances 14 and 15. The collector electrodes of transistors T6 and T7 are connected through resistances 16 and 17 respectively to one terminal 20 which, as indicated in the drawing is connected to a suitable positive potential bias source. The collector electrodes of transistors T6 and T7 also are connected to output terminals 21 and 22.

The emitter electrodes of transistors T4 and T5 are connected to the bias potential source through a potentiometer 26 which provides, in effect, a variable resistance in each of the respective emitter circuits. The potentiometer includes a resistance 27 the ends of which are each connected to the emitters of transistors T4 and T5 respectively. A wiper arm 28, connected to the terminal 20, contacts the resistor 27 to thereby vary the current supplied to the emitter-collector circuits of the transistors T4 and T5. Resistors 30, 31 and 32 form a parallel current path with the potentiometer 26 to permit the latter to be utilized for fine current adjustment.

The transistor T3 provides a constant current source to the emitter-collector circuits of the transistors T1 and T2; the emitter electrode of transistor T3 is connected through resistor 34 to a second terminal 35 which, as shown in FIGURE 1, is connected to the negative side of the bias potential source. Since the constant current source transistor T3 operates to regulate the total current flowing through the first stage of the amplifier, a feedback loop may be provided by connecting the base electrode of transistor T3 to the junction of the resistors 14 and 15. In this manner, a common mode negative feedback loop is formed which includes the emitter-collector circuits of transistors T1 and T2, the base-emitter circuits of transistors T6 and T7, and the resistor 14. The common mode negative feedback acts to improve the discrimination factor (defined as the ratio of differential mode to common mode gain) and also improves the common mode rejection factor (defined as the ratio of the common mode voltage input to the differential mode voltage input to produce the same output voltage). The differential amplifier of the present invention permits the elimination of the collector resistances of the first stage through the incorporation of the transistors T4 and T5 and the implementation of a negative feedback bias loop. Transistors T4 and T5 have their respective base electrodes connected in parallel and to the junction between negative feedback bias voltage divider resistances 38 and 39. Resistor 38 is connected between the resistor 39 and the terminal 20; whereas, resistor 39 is connected between the resistor 38 and the emitter electrodes of transistors T6 and T7. The negative feedback bias loop thus provided includes the emitter-collector circuits of transistors T1 and T2 as well as T4 and T5, the potentiometer 26, the voltage divider resistors 38 and 39, the resistor 14, and the base-collector circuit of the transistor T3. It may be noted that the negative feedback bias loop shares the resistance 14 and transistor T3 with the common mode negative feedback loop.

The operation of the circuit of the present invention may best be described by assuming the bias voltage on the collector electrodes of transistors T1 and T2 to be reduced to a value lower than desired. The resulting drop in the bias voltage causes reduced current flow through transistors T6 and T7 with a subsequent reduced voltage drop through the voltage divider comprising resistors 14 and 15. The lower voltage drop across the voltage divider will result in reduced current through transistor T3 and therefore reduce current in the collector circuits of transistors T1 and T2. A prior art design, incorporating a passive collector load on the transistors T1 and T2 could only attempt to compensate for this deficiency; however, the low bias voltage on the collector of transistors T1 and T2 (resulting in the decreased voltage drop across resistors 14 and 15) effectively lowers the voltage at the junction of resistors 38 and 39, causing an increase in the current flow through the emitter-collector circuits of transistors T4 and T5. This increase in current subsequently restores the bias voltage on the collectors of T1 and T2. Thus, it may be seen that the unique combination of the common mode negative feedback loop and the negative feedback bias loop results in a cooperative effort to maintain the collector bias voltage constant. The constancy of this voltage is maintained without the utilization of large resistances heretofore incorporated in prior art designs; the utilization of transistors T4 and T5 render the present design feasible for construction using microelectronic integrated circuit techniques.

The temperature dependence of the amplifier is improved by maintaining the base-to-emitter voltages of transistors T1 and T2 equal. The equal bias voltages are forced on transistors T1 and T2 by adjusting the wiper arm 28 of the potentiometer 26; as indicated previously, positioning of the wiper arm 28 unbalances the currents flowing through the respective emitter-collector circuits of transistors T1, T2, T4 and T5. The base-to-emitter voltages on transistors T1 and T2 may thus be forced to be equal to insure minimum input offset voltage drift with temperature.

It will be obvious to those skilled in the art that many modifications of the present circuit may be made without departing from the spirit and scope of the invention. For example, the utilization of NPN or PNP transistors may, in certain applications, be a matter of choice; similarly, the number of stages in any particular amplifier may be dictated by various considerations not discussed in connection with the drawing. It is therefore intended that the present invention be limited only by the scope of the claims appended hereto.

We claim:

1. In a transistor differential amplifier having: a first and a second connection means for connection to a potential bias source, a pair of input transistors for receiving an input signal between the base electrodes thereof, and a common mode negative feedback path, said path including a negative feedback resistor connected to said second connection means, the improvement comprising: a pair of dynamic load transistors each having the emitter-collector circuits thereof connected in series with the emitter-collector circuits of a different one of said input transistors and connected through a variable resistance to said first connection means; a bias resistor connected between said first connection means and said negative feedback resistor to thereby provide a negative feedback bias loop; and means connecting the base electrodes of said dynamic load transistors in parallel with each other and to said bias resistor.

2. In a transistor differential amplifier having: a first and a second connection means for connection to a potential bias source, a pair of input transistors for receiving an input signal between the base electrodes thereof, and a common mode negative feedback path, said path including a negative feedback resistor connected to said second connection means, the improvement comprising: a pair of dynamic load transistors each having the emitter-collector circuits thereof connected in series with the emitter-collector circuits of a different one of said input transistors and connected through a variable resistance to said first connection means; a voltage divider connected between said first connection means and said negative feedback resistor to thereby provide a negative feedback bias loop; and means connecting the base electrodes of said dynamic load transistors in parallel with each other and to said voltage divider.

3. The circuit set forth in claim 2 wherein said dynamic load transistors are complementary types relative to said input transistors.

4. The circuit set forth in claim 2 wherein said input transistors are NPN type and said dynamic load transistors are PNP type.

5. The circuit set forth in claim 2 wherein said variable resistance comprises a potentiometer having a resistance the opposite ends of which are connected to the emitter-collector circuits of different dynamic load transistors and having a wiper arm connected to said first connection means.

6. In a two-stage transistor differential amplifier having: a first and a second connection means for connection to a potential bias source, a pair of input transistors for receiving an input signal between the base electrodes thereof, a pair of second-stage transistors having the base electrodes thereof each connected to an emitter-collector circuit of a different one of said input transistors, a common mode negative feedback path, said path including a negative feedback resistor connected to said second connection means, means connecting the emitter-collector circuits of said second-stage transistors in parallel between said first connection means and said negative feedback resistor, the improvement comprising: a pair of dynamic load transistors each having the emitter-collector circuits thereof connected in series with the emitter-collector circuits of a different one of said input transistors and connected through a variable resistance to said first connection means; a voltage divider connected between said first connection means and said negative feedback resistor to thereby provide a negative feedback bias loop; and means connecting the base electrodes of said dynamic load transistors in parallel with each other and to said voltage divider.

7. The circuit set forth in claim 6 wherein said dynamic load transistors are complementary types relative to said input transistors.

8. The circuit set forth in claim 6 wherein said input transistors are NPN type and said dynamic load transistors are PNP type.

9. The circuit set forth in claim 6 wherein the variable resistance comprises a potentiometer having a resistance the opposite ends of which are connected to the emitter-collector circuits of different dynamic load transistors and having a wiper arm connected to said first connection means.

10. A transistor amplifier comprising: a first and a second connection means for connection to a potential bias source, a pair of input transistors for receiving an input signal between the base electrodes thereof; a pair of second-stage transistors having the base electrodes thereof each connected to a collector electrode of a different one of said input transistors; a common mode negative feedback voltage divider connected between the emitter electrodes of said second-stage transistors and said second connection means; an emitter current source transistor having a collector electrode connected to the emitter electrodes of said input transistors, an emitter electrode connected through a resistor to said second connection means, and a base electrode connected to said common mode negative feedback voltage divider; a pair of dynamic load transistors, complementary in type to said input transistors, each having a collector electrode connected to the collector electrode of a different one of said input transistors; a potentiometer having a resistance the opposite ends of which are connected to the emitters of different dynamic load transistors and having a wiper arm connected to said first connection means; a negative feedback bias voltage divider connected between said first connection means and the emitter electrodes of said second-stage transistors to thereby provide a negative feedback bias loop; means connecting the base electrodes of said dynamic load transistors in parallel with each other and to said negative feedback bias voltage divider; and means connecting the collector electrodes of said second-stage transistors to said first connection means.

References Cited

UNITED STATES PATENTS 3,275,944 9/1966 Lavin ------------- 330—69 X

ROY LAKE, *Primary Examiner.*

LAWRENCE J. DAHL, *Assistant Examiner.*

U.S. Cl. X.R.

330—18, 25